(12) United States Patent
Yu et al.

(10) Patent No.: US 9,991,224 B2
(45) Date of Patent: Jun. 5, 2018

(54) BUMP-ON-TRACE INTERCONNECT HAVING VARYING WIDTHS AND METHODS OF FORMING SAME

(71) Applicant: Taiwan Semiconductor Manufacturing Company, Ltd., Hsin-Chu (TW)

(72) Inventors: Chen-Hua Yu, Hsin-Chu (TW); Chen-Shien Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/065,632

(22) Filed: Mar. 9, 2016

(65) Prior Publication Data
US 2016/0190090 A1 Jun. 30, 2016

Related U.S. Application Data

(62) Division of application No. 13/653,618, filed on Oct. 17, 2012, now Pat. No. 9,299,674.
(Continued)

(51) Int. Cl.
*H01L 21/44* (2006.01)
*H01L 23/00* (2006.01)
(Continued)

(52) U.S. Cl.
CPC .............. *H01L 24/81* (2013.01); *H01L 24/13* (2013.01); *H01L 24/16* (2013.01);
(Continued)

(58) Field of Classification Search
CPC ..... H01L 2924/381; H01L 2225/81815; H01L 2225/06513
(Continued)

(56) References Cited

U.S. PATENT DOCUMENTS

| 4,258,382 A | 3/1981 | Harris |
| 4,536,421 A | 8/1985 | Matsuzawa et al. |
| (Continued) | | |

FOREIGN PATENT DOCUMENTS

| CN | 101080138 A | 11/2007 |
| CN | 101188219 A | 5/2008 |
| (Continued) | | |

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Joseph C Nicely
*Assistant Examiner* — Wilner Jean Baptiste
(74) *Attorney, Agent, or Firm* — Slater Matsil, LLP

(57) ABSTRACT

Disclosed herein is a bump-on-trace interconnect with a wetted trace sidewall and a method for fabricating the same. A first substrate having conductive bump with solder applied is mounted to a second substrate with a trace disposed thereon by reflowing the solder on the bump so that the solder wets at least one sidewall of the trace, with the solder optionally wetting between at least half and all of the height of the trace sidewall. A plurality of traces and bumps may also be disposed on the first substrate and second substrate with a bump pitch of less than about 100 μm, and volume of solder for application to the bump calculated based on at least one of a joint gap distance, desired solder joint width, predetermined solder joint separation, bump geometry, trace geometry, minimum trace sidewall wetting region height and trace separation distance.

20 Claims, 6 Drawing Sheets

Related U.S. Application Data

(60) Provisional application No. 61/625,980, filed on Apr. 18, 2012.

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2224/131* (2013.01); *H01L 2224/13017* (2013.01); *H01L 2224/13076* (2013.01); *H01L 2224/13082* (2013.01); *H01L 2224/13144* (2013.01); *H01L 2224/16058* (2013.01); *H01L 2224/16148* (2013.01); *H01L 2224/16225* (2013.01); *H01L 2224/73204* (2013.01); *H01L 2224/81143* (2013.01); *H01L 2224/81191* (2013.01); *H01L 2224/81815* (2013.01); *H01L 2225/06513* (2013.01); *H01L 2225/06593* (2013.01); *H01L 2924/01322* (2013.01); *H01L 2924/381* (2013.01)

(58) Field of Classification Search
USPC .................................................. 438/613, 121
See application file for complete search history.

(56) References Cited

U.S. PATENT DOCUMENTS

| | | | |
|---|---|---|---|
| 4,811,082 A | 3/1989 | Jacobs et al. |
| 4,830,723 A | 5/1989 | Galvagni et al. |
| 4,990,462 A | 2/1991 | Sliwa, Jr. |
| 5,075,253 A | 12/1991 | Sliwa, Jr. |
| 5,075,965 A | 12/1991 | Carey et al. |
| 5,130,779 A | 7/1992 | Agarwala et al. |
| 5,134,460 A | 7/1992 | Brady et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,492,266 A | 2/1996 | Hoebener et al. |
| 5,508,561 A * | 4/1996 | Tago ....................... H01L 24/11 257/737 |
| 5,542,601 A | 8/1996 | Fallon et al. |
| 5,565,379 A | 10/1996 | Baba |
| 5,587,337 A | 12/1996 | Idaka et al. |
| 5,680,187 A | 10/1997 | Nagayama et al. |
| 5,743,006 A | 4/1998 | Beratan |
| 5,790,377 A | 8/1998 | Schreiber et al. |
| 5,796,591 A | 8/1998 | Dalal et al. |
| 5,816,478 A | 10/1998 | Kaskoun et al. |
| 5,889,326 A | 3/1999 | Tanaka |
| 5,922,496 A | 7/1999 | Dalal et al. |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,051,273 A | 4/2000 | Dalal et al. |
| 6,082,610 A | 7/2000 | Shangguan et al. |
| 6,091,141 A | 7/2000 | Heo |
| 6,099,935 A | 8/2000 | Brearley et al. |
| 6,130,476 A | 10/2000 | LaFontaine, Jr. et al. |
| 6,137,184 A | 10/2000 | Ikegami |
| 6,181,010 B1 | 1/2001 | Nozawa |
| 6,187,678 B1 | 2/2001 | Gaynes et al. |
| 6,229,216 B1 | 5/2001 | Ma et al. |
| 6,229,220 B1 * | 5/2001 | Saitoh ..................... H01L 24/81 257/738 |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,259,159 B1 | 7/2001 | Dalal et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,336,262 B1 | 1/2002 | Dalal et al. |
| 6,344,234 B1 | 2/2002 | Dalal et al. |
| 6,346,469 B1 | 2/2002 | Greer |
| 6,355,501 B1 | 3/2002 | Fung et al. |
| 6,358,847 B1 | 3/2002 | Li et al. |
| 6,388,322 B1 | 5/2002 | Goossen et al. |
| 6,424,037 B1 | 7/2002 | Ho et al. |
| 6,426,556 B1 | 7/2002 | Lin |
| 6,434,016 B2 | 8/2002 | Zeng et al. |
| 6,448,661 B1 | 9/2002 | Kim et al. |
| 6,461,895 B1 | 10/2002 | Liang et al. |
| 6,469,394 B1 | 10/2002 | Wong et al. |
| 6,475,897 B1 | 11/2002 | Hosaka |
| 6,476,503 B1 * | 11/2002 | Imamura ............... H01L 21/561 257/737 |
| 6,492,197 B1 | 12/2002 | Rinne |
| 6,498,308 B2 | 12/2002 | Sakamoto |
| 6,562,653 B1 | 5/2003 | Ma et al. |
| 6,565,657 B2 | 5/2003 | Huthmacher |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,592,657 B2 | 7/2003 | Lee et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta et al. |
| 6,731,003 B2 | 5/2004 | Joshi et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,192,803 B1 | 3/2007 | Lin et al. |
| 7,215,033 B2 | 5/2007 | Lee et al. |
| 7,245,023 B1 | 7/2007 | Lin |
| 7,251,484 B2 | 7/2007 | Aslanian |
| 7,271,483 B2 | 9/2007 | Lin et al. |
| 7,271,484 B2 | 9/2007 | Reiss et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |

(56) References Cited

U.S. PATENT DOCUMENTS

| | | | |
|---|---|---|---|
| 7,569,935 B1 | 8/2009 | Fan | |
| 7,576,435 B2 | 8/2009 | Chao | |
| 7,659,631 B2 | 2/2010 | Kamins et al. | |
| 7,714,235 B1 | 5/2010 | Pedersen et al. | |
| 7,804,177 B2 | 9/2010 | Lu et al. | |
| 7,834,450 B2 | 11/2010 | Kang | |
| 7,939,939 B1 | 5/2011 | Zeng et al. | |
| 7,946,331 B2 | 5/2011 | Trezza et al. | |
| 8,026,128 B2* | 9/2011 | Pendse | H01L 21/563 257/734 |
| 8,076,232 B2 | 12/2011 | Pendse | |
| 8,093,729 B2 | 1/2012 | Trezza | |
| 8,120,175 B2 | 2/2012 | Farooq et al. | |
| 8,130,475 B2 | 3/2012 | Kawamori et al. | |
| 8,158,489 B2 | 4/2012 | Huang et al. | |
| 8,207,604 B2 | 6/2012 | Haba et al. | |
| 8,232,640 B2 | 7/2012 | Tomoda et al. | |
| 8,258,055 B2 | 9/2012 | Hwang et al. | |
| 8,313,213 B2 | 11/2012 | Lin et al. | |
| 8,367,939 B2 | 2/2013 | Ishido | |
| 8,435,881 B2 | 5/2013 | Choi et al. | |
| 8,576,368 B2 | 11/2013 | Kim et al. | |
| 8,823,166 B2 | 9/2014 | Lin et al. | |
| 9,105,530 B2 | 8/2015 | Lin et al. | |
| 9,355,980 B2 | 5/2016 | Chen et al. | |
| 9,583,687 B2 | 2/2017 | Hwang | |
| 2001/0013423 A1 | 8/2001 | Dalal et al. | |
| 2001/0038147 A1 | 11/2001 | Higashi et al. | |
| 2002/0033412 A1 | 3/2002 | Tung | |
| 2002/0084528 A1 | 7/2002 | Kim et al. | |
| 2002/0100974 A1 | 8/2002 | Uchiyama | |
| 2002/0106832 A1 | 8/2002 | Hotchkiss et al. | |
| 2002/0197811 A1 | 12/2002 | Sato | |
| 2003/0049886 A1 | 3/2003 | Salmon | |
| 2003/0092219 A1* | 5/2003 | Ohuchi | H01L 21/78 438/110 |
| 2003/0094963 A1 | 5/2003 | Fang | |
| 2003/0166331 A1 | 9/2003 | Tong et al. | |
| 2003/0216025 A1 | 11/2003 | Lu et al. | |
| 2003/0218250 A1 | 11/2003 | Kung et al. | |
| 2003/0233133 A1 | 12/2003 | Greenberg et al. | |
| 2004/0004284 A1 | 1/2004 | Lee et al. | |
| 2004/0007779 A1 | 1/2004 | Arbuthnot et al. | |
| 2004/0140538 A1 | 7/2004 | Harvey | |
| 2004/0159944 A1 | 8/2004 | Datta et al. | |
| 2004/0166661 A1 | 8/2004 | Lei | |
| 2004/0212098 A1* | 10/2004 | Pendse | H01L 24/16 257/778 |
| 2004/0251546 A1 | 12/2004 | Lee et al. | |
| 2005/0017376 A1 | 1/2005 | Tsai | |
| 2005/0062153 A1 | 3/2005 | Saito et al. | |
| 2005/0158900 A1 | 7/2005 | Lee et al. | |
| 2005/0212114 A1 | 9/2005 | Kawano et al. | |
| 2005/0224991 A1 | 10/2005 | Yeo | |
| 2005/0253264 A1 | 11/2005 | Aiba et al. | |
| 2005/0277283 A1 | 12/2005 | Lin et al. | |
| 2006/0012024 A1 | 1/2006 | Lin et al. | |
| 2006/0017160 A1 | 1/2006 | Huang | |
| 2006/0038303 A1 | 2/2006 | Sterrett et al. | |
| 2006/0051954 A1 | 3/2006 | Lin et al. | |
| 2006/0055032 A1 | 3/2006 | Chang et al. | |
| 2006/0076677 A1 | 4/2006 | Daubenspeck et al. | |
| 2006/0209245 A1 | 9/2006 | Mun et al. | |
| 2006/0223313 A1 | 10/2006 | Yoon et al. | |
| 2006/0279881 A1 | 12/2006 | Sato | |
| 2006/0292824 A1 | 12/2006 | Beyne et al. | |
| 2007/0001280 A1 | 1/2007 | Hua | |
| 2007/0012337 A1 | 1/2007 | Hillman et al. | |
| 2007/0018294 A1 | 1/2007 | Sutardja | |
| 2007/0020906 A1 | 1/2007 | Chiu et al. | |
| 2007/0023483 A1 | 2/2007 | Yoneyama et al. | |
| 2007/0045840 A1 | 3/2007 | Varnau | |
| 2007/0057022 A1 | 3/2007 | Mogami et al. | |
| 2007/0114663 A1 | 5/2007 | Brown et al. | |
| 2007/0200234 A1 | 8/2007 | Gerber et al. | |
| 2008/0003402 A1 | 1/2008 | Haba et al. | |
| 2008/0003715 A1 | 1/2008 | Lee et al. | |
| 2008/0087998 A1 | 4/2008 | Kamins et al. | |
| 2008/0128911 A1 | 6/2008 | Koyama | |
| 2008/0150135 A1 | 6/2008 | Oyama et al. | |
| 2008/0169544 A1 | 7/2008 | Tanaka et al. | |
| 2008/0194095 A1 | 8/2008 | Daubenspeck et al. | |
| 2008/0217047 A1 | 9/2008 | Hu | |
| 2008/0218061 A1 | 9/2008 | Chao et al. | |
| 2008/0277785 A1 | 11/2008 | Hwan et al. | |
| 2009/0025215 A1 | 1/2009 | Murakami et al. | |
| 2009/0042144 A1 | 2/2009 | Kitada et al. | |
| 2009/0045499 A1 | 2/2009 | Kim et al. | |
| 2009/0075469 A1* | 3/2009 | Furman | H01L 21/563 438/613 |
| 2009/0087143 A1 | 4/2009 | Jeon et al. | |
| 2009/0096092 A1 | 4/2009 | Patel | |
| 2009/0108443 A1 | 4/2009 | Jiang | |
| 2009/0146316 A1 | 6/2009 | Jadhav et al. | |
| 2009/0149016 A1 | 6/2009 | Park et al. | |
| 2009/0166861 A1 | 7/2009 | Lehr et al. | |
| 2009/0174067 A1 | 7/2009 | Lin | |
| 2009/0218702 A1 | 9/2009 | Beyne et al. | |
| 2009/0233436 A1 | 9/2009 | Kim et al. | |
| 2009/0250814 A1 | 10/2009 | Pendse et al. | |
| 2010/0007019 A1 | 1/2010 | Pendse | |
| 2010/0044860 A1 | 2/2010 | Naha et al. | |
| 2010/0052473 A1 | 3/2010 | Kimura et al. | |
| 2010/0084763 A1 | 4/2010 | Yu | |
| 2010/0141880 A1 | 6/2010 | Koito et al. | |
| 2010/0193944 A1 | 8/2010 | Castro et al. | |
| 2010/0200279 A1 | 8/2010 | Kariya et al. | |
| 2010/0252926 A1 | 10/2010 | Kato et al. | |
| 2010/0258950 A1 | 10/2010 | Li et al. | |
| 2010/0270458 A1 | 10/2010 | Lake et al. | |
| 2010/0276787 A1 | 11/2010 | Yu et al. | |
| 2010/0314745 A1 | 12/2010 | Masumoto et al. | |
| 2010/0327422 A1 | 12/2010 | Lee et al. | |
| 2011/0001250 A1 | 1/2011 | Lin et al. | |
| 2011/0024902 A1 | 2/2011 | Lin et al. | |
| 2011/0038147 A1 | 2/2011 | Lin et al. | |
| 2011/0074022 A1 | 3/2011 | Pendse et al. | |
| 2011/0084386 A1* | 4/2011 | Pendse | H01L 23/3178 257/737 |
| 2011/0101519 A1 | 5/2011 | Hsiao et al. | |
| 2011/0101526 A1 | 5/2011 | Hsiao et al. | |
| 2011/0169158 A1 | 7/2011 | Varnasi | |
| 2011/0177686 A1 | 7/2011 | Zeng et al. | |
| 2011/0186986 A1 | 8/2011 | Chuang et al. | |
| 2011/0193220 A1 | 8/2011 | Kuo et al. | |
| 2011/0227219 A1 | 9/2011 | Alvarado et al. | |
| 2011/0244675 A1 | 10/2011 | Huang et al. | |
| 2011/0248399 A1* | 10/2011 | Pendse | H01L 24/09 257/737 |
| 2011/0260317 A1 | 10/2011 | Lu et al. | |
| 2011/0285011 A1 | 11/2011 | Hwang et al. | |
| 2011/0285023 A1 | 11/2011 | Shen et al. | |
| 2012/0007230 A1 | 1/2012 | Hwang et al. | |
| 2012/0007231 A1 | 1/2012 | Chang | |
| 2012/0012997 A1* | 1/2012 | Shen | H01L 23/49816 257/737 |
| 2012/0025365 A1 | 2/2012 | Haba | |
| 2012/0040524 A1 | 2/2012 | Kuo et al. | |
| 2012/0049346 A1 | 3/2012 | Lin et al. | |
| 2012/0091577 A1 | 4/2012 | Hwang et al. | |
| 2012/0098120 A1 | 4/2012 | Yu et al. | |
| 2012/0098124 A1 | 4/2012 | Wu et al. | |
| 2012/0146168 A1 | 6/2012 | Hsieh et al. | |
| 2012/0223428 A1 | 9/2012 | Pendse | |
| 2012/0306080 A1 | 12/2012 | Yu et al. | |
| 2013/0026622 A1 | 1/2013 | Chuang et al. | |
| 2013/0026629 A1 | 1/2013 | Nakano | |
| 2013/0087920 A1 | 4/2013 | Jeng et al. | |
| 2013/0093079 A1 | 4/2013 | Tu et al. | |
| 2013/0181340 A1 | 7/2013 | Uehling et al. | |
| 2013/0252418 A1 | 9/2013 | Arvin et al. | |
| 2013/0270699 A1 | 10/2013 | Kuo et al. | |
| 2013/0277830 A1 | 10/2013 | Yu et al. | |
| 2013/0288473 A1 | 10/2013 | Chuang et al. | |

(56) References Cited

U.S. PATENT DOCUMENTS

| | | |
|---|---|---|
| 2013/0341785 A1 | 12/2013 | Fu et al. |
| 2014/0048929 A1 | 2/2014 | Cha et al. |
| 2014/0054764 A1 | 2/2014 | Lu et al. |
| 2014/0054769 A1 | 2/2014 | Yoshida et al. |
| 2014/0054770 A1 | 2/2014 | Yoshida et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077359 A1 | 3/2014 | Tsai et al. |
| 2014/0077360 A1 | 3/2014 | Lin et al. |
| 2014/0077365 A1 | 3/2014 | Lin et al. |
| 2014/0117533 A1 | 5/2014 | Lei et al. |
| 2014/0264890 A1 | 9/2014 | Breuer et al. |
| 2014/0346669 A1 | 11/2014 | Wang et al. |
| 2014/0353820 A1 | 12/2014 | Yu et al. |
| 2015/0091160 A1 | 4/2015 | Reber |
| 2015/0325542 A1 | 11/2015 | Lin et al. |
| 2016/0254240 A1 | 9/2016 | Chen |
| 2016/0329293 A1 | 11/2016 | Cha et al. |

FOREIGN PATENT DOCUMENTS

| | | |
|---|---|---|
| CN | 102254871 A | 11/2011 |
| CN | 102386158 A | 3/2012 |
| CN | 102468197 A | 5/2012 |
| EP | 1387402 A2 | 2/2004 |
| KR | 1020110002816 A | 1/2011 |
| KR | 1020110128532 A | 11/2011 |
| TW | 200826265 A | 6/2008 |
| TW | 200915452 A | 4/2009 |
| TW | 201133662 | 10/2011 |
| TW | 201143007 A | 12/2011 |
| WO | 2009140238 A2 | 11/2009 |

\* cited by examiner

BUMP-ON-TRACE INTERCONNECT HAVING VARYING WIDTHS AND METHODS OF FORMING SAME

CROSS REFERENCE TO RELATED APPLICATIONS

This application is a divisional to U.S. patent application Ser. No. 13/653,618, filed on Oct. 17, 2012 entitled "Bump-on-Trace Interconnect," which is related to, and claims priority to U.S. Provisional Application No. 61/625,980, titled, "Semiconductor Device Package" filed on Apr. 18, 2012, which is herein incorporated by reference.

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Designers have attempted to overcome the limits of transistor size by packaging ever larger subsystems into one chip (systems on chip), or by reducing the distance between chips, and subsequent interconnect distance.

One method used to reduce the distance between various chips forming a system is to stack chips, with electrical interconnects running vertically. This can involve multiple substrate layers, with chips on the upper and lower surfaces of a substrate. One method for applying chips to the upper and lower side of a substrate is called "flip-chip" packaging, where a substrate has conductive vias disposed through the substrate to provide an electrical connection between the upper and lower surfaces.

Solder ball grid arrays are also a technique sometimes used to joining packages, with an array of solder balls deposited on the bonding pads of a first package, and with a second package joined at its own bonding pad sites to the first pad via the solder balls. The environment with the solder ball grid array is heated to melt the solder balls and the packages compressed to cause the solder balls to contact the pads on both packages.

BRIEF DESCRIPTION OF THE DRAWINGS

For a more complete understanding of the present disclosure, and the advantages thereof, reference is now made to the following descriptions taken in conjunction with the accompanying drawing, in which.

DETAILED DESCRIPTION

Figure 1:
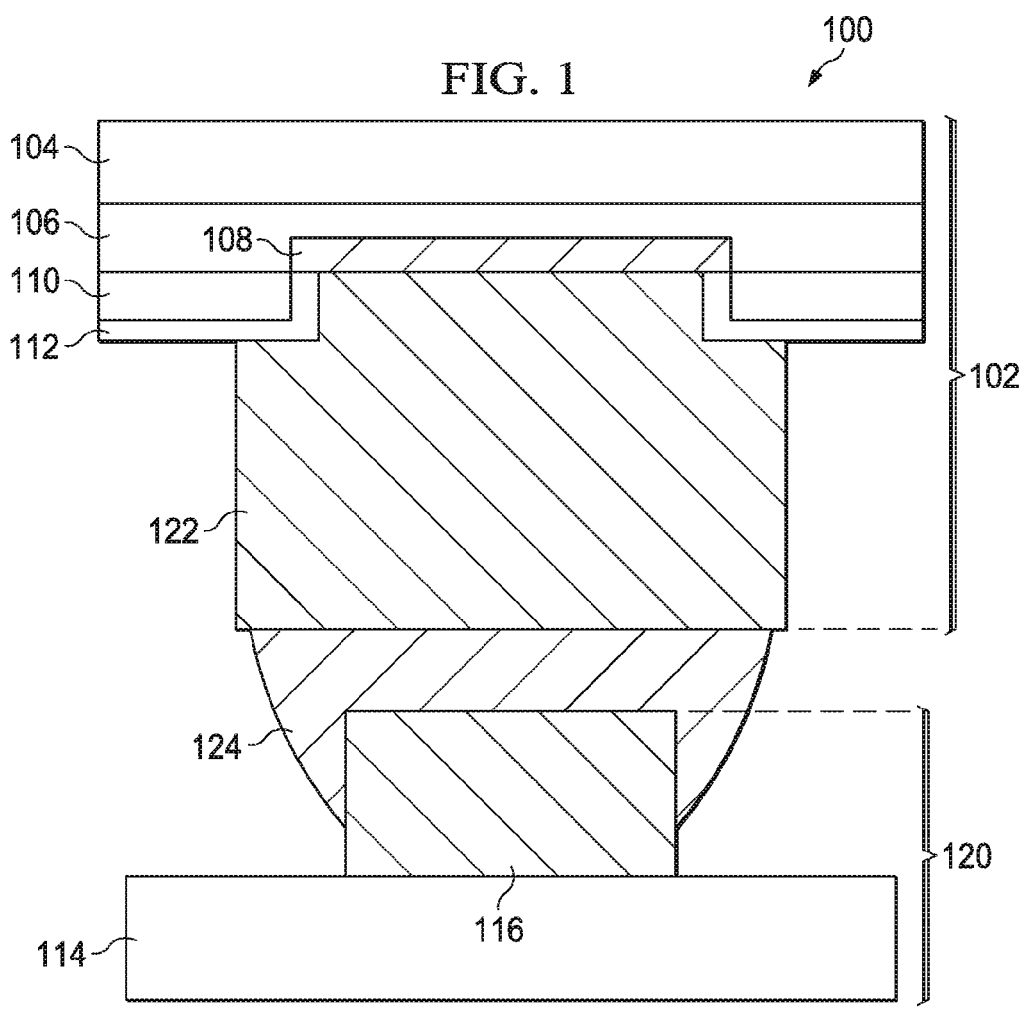
FIGS. 1 and 2 are cross-sectional diagrams of embodiments of a BoT interconnect element.

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described package, and do not limit the scope of the disclosure.

Embodiments will be described with respect to a specific context, namely making and using bump-on-trace interconnects useful in, for example, package-on-package assemblies. Other embodiments may also be applied, however, to other electrically connected components, including, but not limited to, bare chips, displays, input components, board mounting, die or component mounting, or connection packaging or mounting of combinations of any type of integrated circuit or electrical component.

The embodiments of the present disclosure are described with reference to FIGS. 1 through 5D, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

The present concepts are directed to providing a system and method for creating interconnections having a solder based bump-on-trace (BoT) connection with an improved pitch. Additionally, the disclosed embodiments are not limited to bump-on-trace applications, but may be applied to lead grid arrays (LGAs) where an array of conductive structures protrudes from a package for attachment to another package. LGA leads may be formed to have flexibility to absorb thermal or physical stress in a package-on-package connection, and solder may be applied to a portion of each LGA lead to attach the lead to a trace or bump.

With BoT connectors having fine pitches (<100 μm), the bump solder tends to not wet the sidewall of a trace under a thermal compression bonding/nonconductive paste (TCB/NCP) process, negatively impacting joint integrity and electro-migration performance. BoT interconnect systems may provide a higher density of interconnects than alternative methods of packaging, and reduce the failure rate of interconnected assemblies. BoT interconnects may be used to attach, or stack multiple packages vertically, connecting the stacked packaged via redirection layer (RDL) contacts, electrical traces, mounting pads or the like.

In general terms, in the illustrated embodiments, a BOT joint can achieve fine pitch assembly with significant trace sidewall solder wetting. In one embodiment, one or both of the trace sidewalls may be wetted, or covered, by solder, at more than half the trace height. Sidewall wetting may provide for advantageous features that include, but are not limited to, improved joint integrity (e.g., reduced trace peeling and T0 joint cracking) and improved electro-migration (EM) performance.

Referring to FIG. 1, a cross-sectional diagram of an embodiment of a package 100 with a sidewall wetting BoT interconnect is depicted. A pillar or bump 122 may be disposed on a first substrate 102 or on another package. In one embodiment, the bump 122 may be copper (Cu), or it may be gold (Au), silver (Ag), palladium (Pd), tantalum (Ta), tin (Sn), lead (Pb), alloys of the same, or another conductive material. Additionally, the bump 122 may have an adhesion or anticorrosion coating such as an organic solderability preservative (OSP), tin (Sn), nickel-gold alloy (NiAu), nickel-platinum-gold alloy (NiPtAi) or the like. While the top package is herein referred to as a first substrate 102, in other embodiments, a flip chip, a display, package, PCB, input board, or any other electronic device may be used within the scope of the present disclosure. Additionally, while a single level of interconnects are described herein, the present disclosure may be applied to a system having multiple packages on any number of levels or in any arrangement. For example, a memory chip may be mounted on a processor using a sidewall wetting BoT interconnect, and the processor/memory combination may be mounted to a PCB or other target package using the sidewall wetting BoT interconnect technique disclosed herein.

In one embodiment, a first substrate 102 may be a chip, package, PCB, die, or the like, and may have a die substrate 104 and one or more metallization layers 106. The metallization layer 106 may, in one embodiment, include a conductive land 108, metallic traces, vias, or the like. An oxide or insulating layer 110 and passivation layer 112 may each optionally be disposed on the surface of the first substrate 102, and may define an opening over the conductive land 108 for the bump 122 to contact or attach to the conductive land 108. In such an embodiment, the bump 122 may be disposed covering a portion of, or the entire exposed portion of, the conductive land 108 not covered by the insulating layer 110 and passivation layer 112. Additionally, the bump 122 may be disposed to cover or contact a portion of the insulation layer 110 or passivation layer 112. In such an embodiment, the bump 122 may be disposed over the conductive land 108 and the insulating layer 110 or passivation layer 112. In some embodiments, the bump 122 may be completely cover the conductive land 108 and contact the insulating layer 110 or passivation layer 112 on all sides of the conductive land 108 to seal the conductive land 108 from the environment.

The first substrate 102 may be electrically coupled to a die substrate 114 disposed in the second substrate 120 and having a conductive trace 116 formed thereon. The trace 116, in one embodiment, may be deposited as a blanket surface and patterned, but in other embodiments, may be formed via a damascene process, or the like. Additionally, the trace 116 may, in one embodiment, be copper, or another conductive material, and may optionally have an anticorrosion coating such as an OSP, metallic coating or the like.

Application of a conductive material 124, such as solder, may assist in retaining the electrical connection between the bump 122 and the trace 116. Solder joints avoid electromigration issues, and the use of sidewall wetting creates a stronger joint at the solder joint 124 to trace 116 junction. Such sidewall wetting may prevent cracking of the joint, or delamination of the solder joint 124 from the trace 116, due in part to an increased surface area, but also due to the material wetting the trace 116 sidewall preventing lateral movement of the solder with respect to the trace 116.

Thermal compression bonding is the welding of two metallic structures using heat and pressure. However, imperfections, such a surface irregularities, oxidation or contaminants on the mating surfaces may create voids when two surfaces are brought together for bonding. Electromigration exists where the flow of electrons in a metal causes atoms to move due to the electrons striking the atom and transferring the electrons' momentum to the atom. EM is a particular problem in small PCB joints due to the grain boundary of the like metals forming the joints, as the migration of metal atoms tends to occur around any voids or impurities in the interface between the two structures forming the joint. This atom migration amplifies the imperfections in the joint, eventually leading to physical failure of the joint.

In one embodiment a conductive material is used to form a mechanical and electrical connection between the bump 122 and trace 116. In some embodiments, the conductive material may be solder; however, another fusible conductive material may be used, such as, but not limited to gold, conductive adhesive, solder paste, or the like. The illustrated configuration illustrates one embodiment with wetting of the sidewalls of the trace 116, which will preferably be at least half the height of the trace 116 sidewall. In another embodiment, the sidewalls of the trace 116 will have solder disposed on, or wetting, at least a portion of one trace 116 sidewall. The wetting may be promoted by treating the trace 116 sidewall to more readily accept the solder. In some embodiments, an active plasma treatment may be applied to prepare the surface for application of the solder joint 124. In another embodiment, the trace 116 sidewall may be chemically treated, for example, to remove oxidation or foreign material from the surface of the trace. However, wetting may be promoted by any process, including surface etching, applying a flux, applying a solder preservative, or the like.

Additionally, the region of the trace 116 sidewall wetted by the solder joint 124 will be a contiguous portion of the solder joint 124, with the entirety of the solder joint 124 being applied or formed in a single step. For example, the solder joint 124 may be reflowed and solidified to create a uniform structure over the trace 116. In another embodiment, the solder joint 124 may extend past the face, or surface of the bump 122 opposite the first substrate 102, and may cover a portion of a sidewall of the bump 122.

The embodiment illustrated in FIG. 1 shows bump 122 having substantially vertical sidewalls. Skilled artisans will recognize that the bump 122 may have a sidewall slope that varies depending on the requirements of the joint. For example, the bump 122 may have sloped sides, or may have a curved or partially circular vertical cross section. Additionally, while the foregoing examples are described in terms of the vertical cross-section, the bump 122 may have virtually any advantageous horizontal cross section. For example, the bump 122 may have a round, square, rectangular or irregularly shaped base in combination with any vertical cross section.

Figure 2:
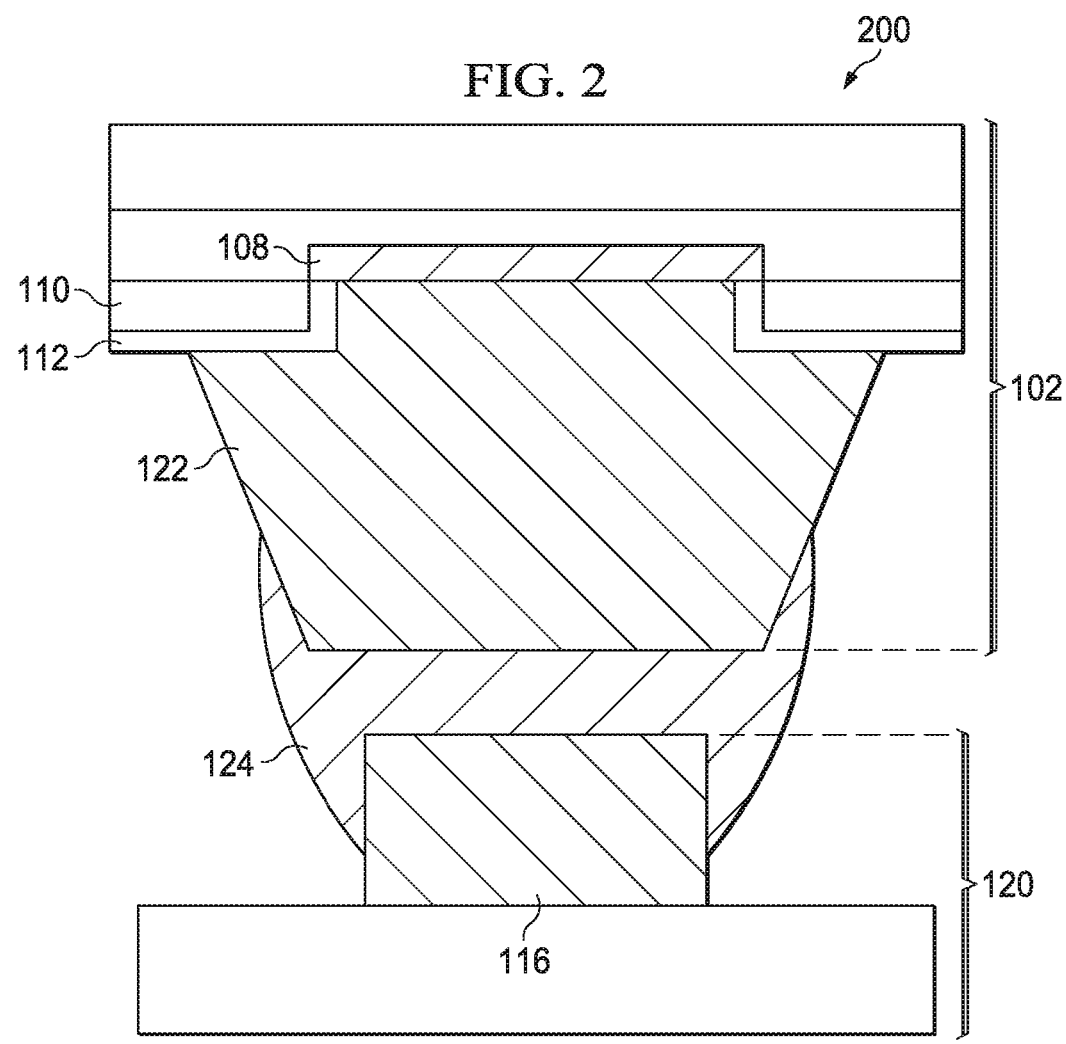

FIG. 2 depicts a cross-sectional diagram of an alternative embodiment of a package 200 with a sidewall wetting BoT interconnect. In such an embodiment, the sidewalls of the bump 122 may be sloped, with the broader, or wider, portion of the bump 122 being disposed at the first substrate 102, and the narrower end having the solder joint 124 disposed thereon. The wider end of the bump may be disposed on the first substrate 102 conductive land 108 and covering a portion of the insulating layer 110 and passivation layer 112. In such an embodiment, the trace 116 may have a portion of the solder joint 124 wetting, or disposed on, a portion of the sidewalls.

Figure 3:
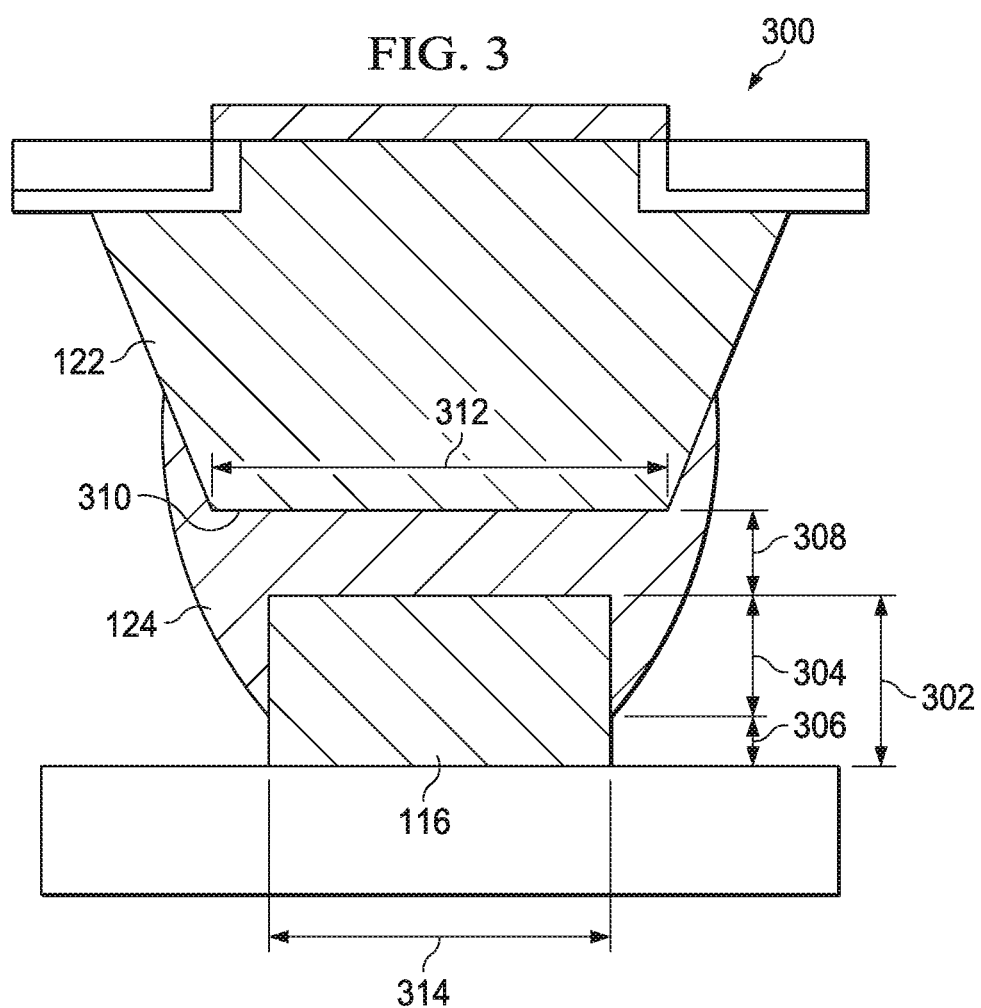
FIG. 3 is an enlarged cross-sectional illustration of a BoT interconnect.
Figure 4:
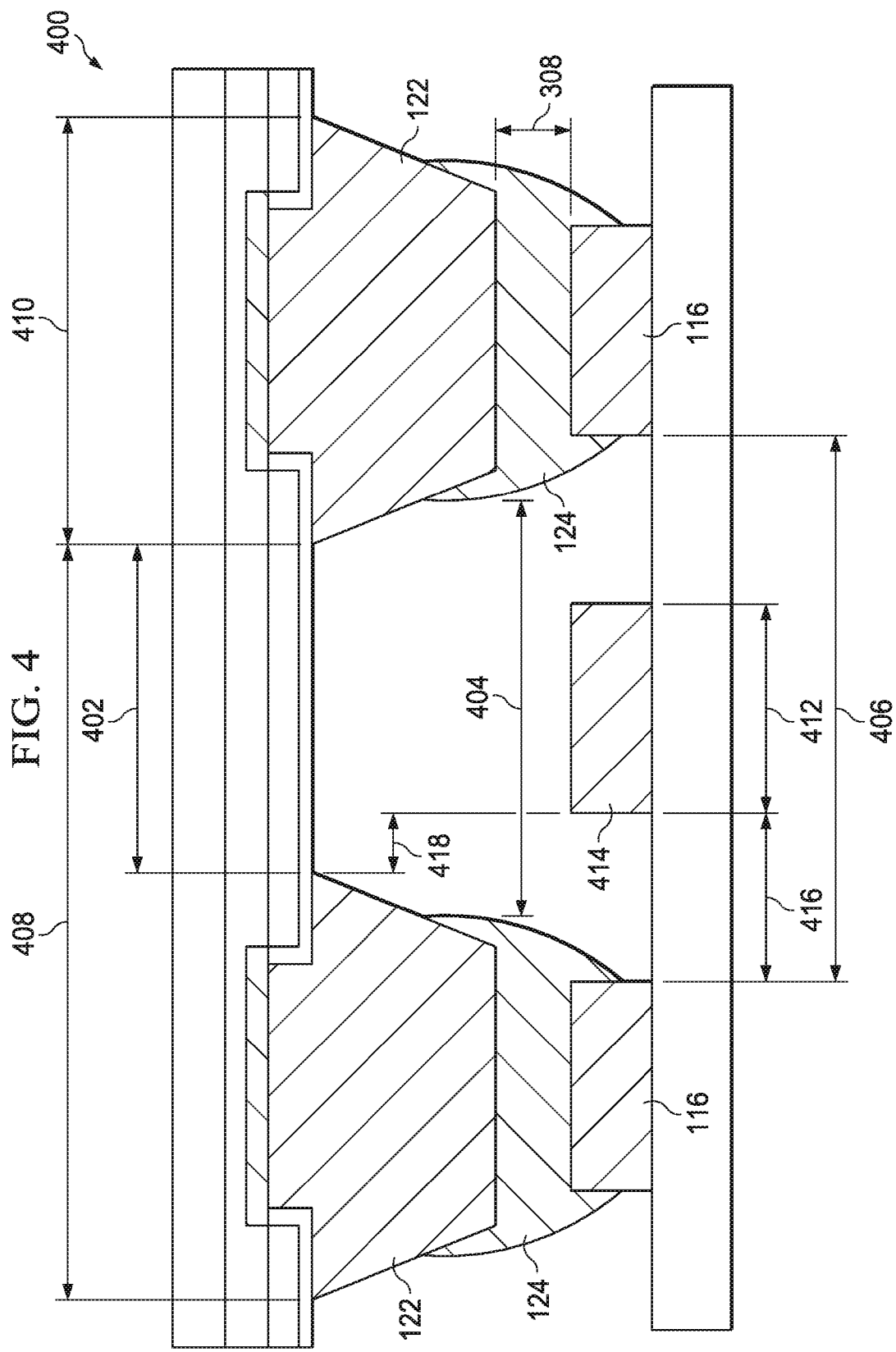
FIG. 4 is cross-sectional illustration of multiple BoT interconnects.

FIG. 3 is an enlarged cross-sectional illustration 300 of a BoT interconnect. Use of a wetted sidewall trace BoT joint may also permit a finer pitch between adjacent interconnects structures. FIG. 4 is cross-sectional illustration of multiple BoT interconnects. In the embodiments shown in FIGS. 3 and 4, the bump 122 has sloped sidewalls, however, a parallel or straight sided bump 122, as illustrated in FIG. 1, or any other described or useful bump shape may be used as well.

Referring now to FIG. 3, the bump face 310 may have a bump face width 312 that may be wider than the trace width 314. The solder joint 124 may have a width greater than the trace width 314. The portion of the solder joint 124 exceeding the trace width 314 may extend below the face of the trace to wet the sidewall of the trace 116. Additionally, in some embodiments, the width of the solder joint 124 may exceed the bump face width 312 to wet the sidewalls of the bump 122. In another embodiment, the width of the solder joint 124 may be about equal to the bump face width 312 and wet the sidewalls of the trace 116. In yet another embodiment, the bump face 310 may be disposed above and separate from the trace 116 by a predetermined joint gap distance 308 that is sufficient to permit solder to reflow through the gap without voids and result in a predetermined joint height.

The sidewall height 302 is comprised of the sidewall wetted region height 304 and the sidewall unwetted region height 306. In one embodiment, the sidewall wetted region height 304 may be at least half of the sidewall height 302. In another embodiment, the sidewall wetted region height 304 may be equal to the sidewall height 302, that is, the entire trace 116 sidewall may be wetted by the solder joint 124.

In one embodiment, the joint gap distance 308 may be the same as the height of the trace, or sidewall height 302. In another embodiment, the joint gap distance 308 may be less than the sidewall height 302 of the trace 116. Therefore, the joint gap distance 308 may be sufficient to permit solder to flow into the gap, and less than the sidewall height 302 of the trace 116.

Referring now to FIG. 4, two bumps 122 are separated by a predetermined distance, that determine the bump pitch 408 in combination with the overall width of the bump 122 and related structures making up a single BoT interconnect. In some embodiments, an adjacent trace 414 may be disposed near a BoT interconnect, and separated from a bump 122 by a bump-to-trace separation width 416. In some embodiments, the adjacent trace width 412 may be narrower than trace width 314. However, the adjacent trace is not limited to having a narrower width, as any dimension of adjacent trace 414 may be used.

The bump pitch 408 is the distance between like elements on adjacent structures, and is comprised of the bump separation distance 402 and the bump width 410, and in one embodiment, the bump pitch 408 may be about 140 μm or less. For the bumps 122 illustrated here, the minimum bump pitch 408 may be determined at least partly by the bump width 410, but also by the solder joint separation width 404 and bump-to-trace separation width 418. The trace separation distance 406 is determined by the bump separation distance 402 in combination with the difference between the trace width 314 and the bump width 410. The solder joint separation width 404 will, in one embodiment, be greater than the bump width 410. This results in a conductive material joint having a width less than the bump width 410.

The solder joint separation width 404 will, in one embodiment, be greater than the bump width 410. In an embodiment with a bump 122 having tapered sidewalls, the solder joint 124 may have a width less than the width of the widest part of the bump 122, or the bump width 410 illustrated herein, and may simultaneously have a width greater than the bump face width 312. Additionally, the solder joint 124 may have a width less than the bump width 410.

The width of the solder joint 124 may be determined by the volume of solder applied to form the solder joint 124. In one embodiment, the volume of solder required to form a solder joint 124 having a predetermined width and trace sidewall wetted region height 304 may be determined by the joint gap distance 308, solder joint separation width 404, bump-to-trace separation distance 416, trace 116 geometry, adjacent trace 414 geometry, and bump 122 geometry. In one embodiment, the volume of solder forming the solder joint 124 will be sufficient to wet the trace 116 sidewalls to a desired height and still provide a solder joint separation width 404 sufficient to prevent bridging of a solder joint 124 to an adjacent solder joint 124 or connection structure.

A method for forming a wetted sidewall trace BoT joint may, in one embodiment, comprise providing a first substrate 102 or other substrate, and forming one or more bumps 122 on the first substrate 102. The volume of a conductive material, such as solder, required for a predetermined width of solder joint 124 may optionally be calculated or optimized using joint parameters including, but not limited to one or more of the joint gap distance 308, a predetermined or desired solder joint width, a predetermined solder joint separation 404, the bump 122 geometry, the trace 116 geometry, the minimum trace 116 sidewall wetting region height or trace separation distance 406. The solder joint 124 may be applied in the calculated volume to the bump 122 as a solder cap.

The first substrate 102 may be singulated or removed from a wafer, singly or in predetermined first substrate 102 strips or groups, and may have final packaging steps performed. A second substrate 120, such as a PCB, chip, package, die, or the like, may be created by placing one or more traces 116 on a die substrate 114, and the first substrate 102 may then be placed on the second substrate 120, with the bump 122 and applied solder caps aligning with traces 116 on the second substrate 120. The assembly of the first substrate 102 and second substrate 120 may be heated for reflow to a temperature where, preferably, the solder reaches at least a eutectic point such that the solder melts or solidifies in a single step, without intermediate phases. The first substrate 102 may be moved towards or held apart from the second substrate 120 at a predetermined distance during reflow so that the bump faces 310 are about a predetermined joint gap distance 308 above the faces of the traces 116, and so that the solder of the solder bump wets the sidewall of the trace 116 to cover about a predetermined portion of the trace 116 sidewall.

Figure 5A:
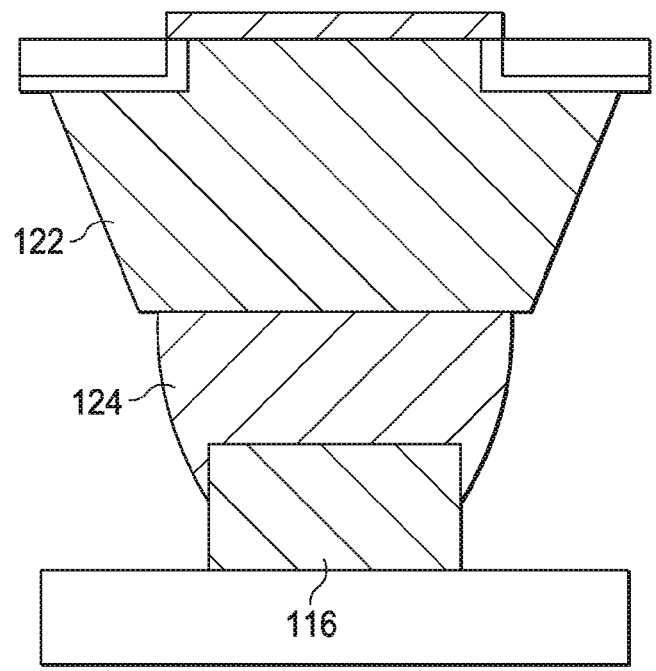
FIGS. 5A-5D are illustrations of embodiments of BoT interconnects.

FIG. 5A illustrates another embodiment of a BoT joint. In such an embodiment, the solder joint 124 may wet the sidewalls of the trace 116, while not wetting the sidewalls of the bump 122. Alternatively, as illustrated in FIG. 5C, the solder ball may wet one side of the bump 122, and not the other. This may be the result of the solder joint 124 forming a bulge 502 where the solder fails to flow along the bump 122 sidewall. This may also be a result of the trace 116 being offset from the bump 122. Thus, the BoT may correct for accidental or intentional misalignment of the trace 116 and bump 122, permitting packages with mismatched mounting arrangements to be joined.

Figure 5B:
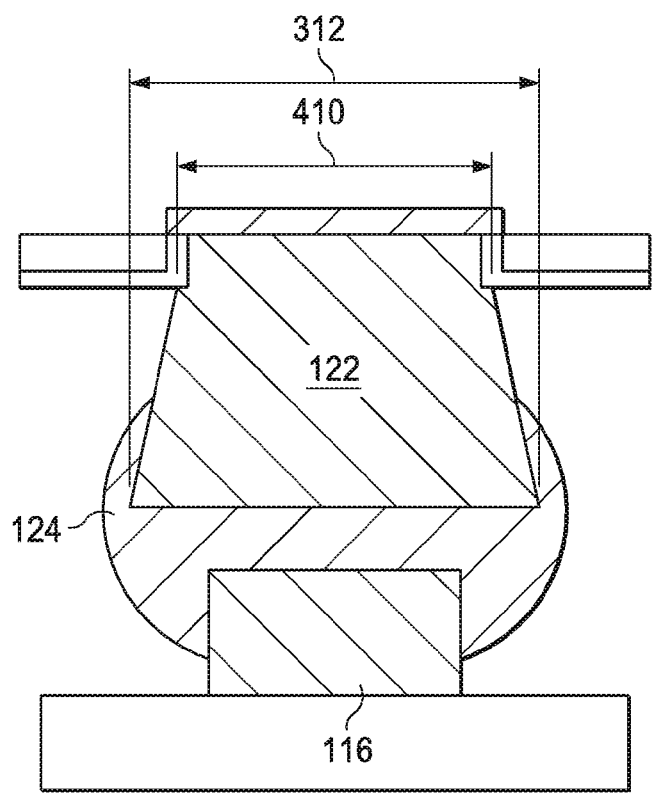
Figure 5C:
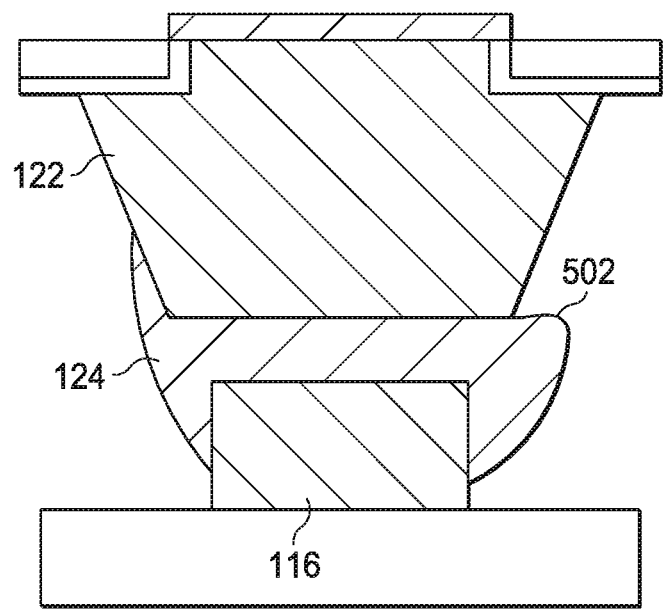
Figure 5D:
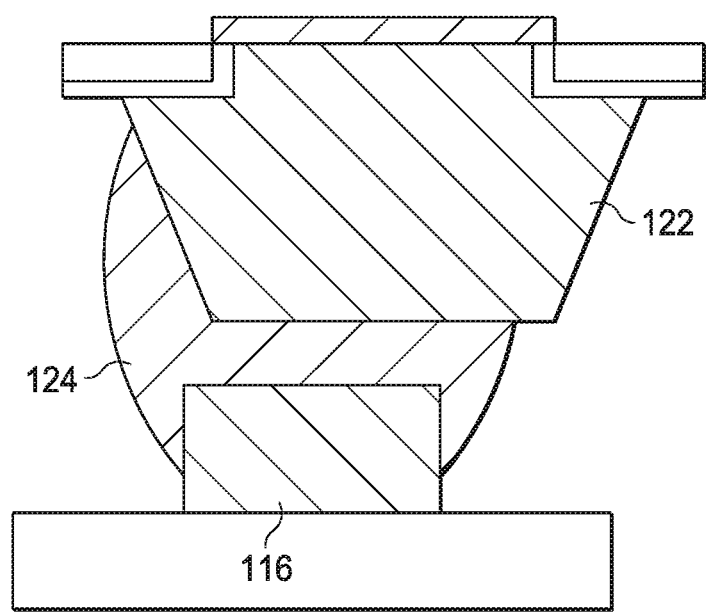

FIG. 5B illustrates an embodiment of a BoT joint with an alternative bump. In such an embodiment, the bump face width 312 may be greater than the base of the bump 122 having bump width 410. The solder joint 124 may, in such an embodiment, wet the sidewalls of the bump 122, further strengthening the attachment of the solder joint 124 to the bump 122 by mechanical means.

In accordance with an embodiment, a method includes providing a first substrate having a bump disposed thereon, and the bump having a volume of conductive material disposed thereon. The method further includes providing a second substrate having a conductive trace, the conductive trace having a sidewall. The method further includes mounting the first substrate on the second substrate. The mounting resulting in an electrical connection from the bump to the conductive trace. The bump is separated from the conductive trace by a distance less than a height of the conductive trace, and the conductive material is at least partially covers a sidewall of the conductive trace.

In accordance with another embodiment, a method includes disposing a solder joint on a bump electrically connected to a conductive land in a first substrate. A first surface of the bump distal to the conductive land has a first width. The method further includes aligning the first substrate to a second substrate by aligning the solder joint to a conductive trace of the second substrate. The method further includes reflowing the solder joint to bond the solder joint with the conductive trace. The solder joint at least partially wets sidewalls of the conductive trace. A lateral surface of the conductive trace contacting the solder joint has a second width less than the first width.

In accordance with yet another embodiment, a method includes disposing a bump on a first package component. The first package component includes a die substrate, a conductive land over the die substrate, and a dielectric layer over and covering edges of the conductive land. The bump is disposed over and electrically connected to the conductive land, and a surface of the bump opposite the conductive land is substantially level, and a sidewall of the bump is substantially straight in a cross-sectional view of the bump. The method further includes disposing a solder ball on the surface of the bump opposite the conductive land; and bonding the first package component to a second package component. After bonding the first package component to the second package component, a portion of the solder ball is disposed on a sidewall of a conductive trace of the second package component.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure that processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   providing a first substrate having a bump disposed thereon, the bump having a volume of conductive material disposed thereon;
   providing a second substrate having a conductive trace, the conductive trace having a sidewall, wherein a first surface of the bump disposed closest to the conductive trace is wider than a second surface of the conductive trace disposed closest to the bump, wherein the first surface of the bump is parallel to the second surface of the conductive trace, wherein a width of the bump continuously decreases from the first substrate to the first surface of the bump closest to the conductive trace in a cross-sectional view; and
   mounting the first substrate on the second substrate, the mounting resulting in an electrical connection from the bump to the conductive trace through the conductive material, wherein the first surface of the bump is closer to the second substrate than the first substrate, wherein the bump is separated from the conductive trace by a distance less than a height of the conductive trace, and wherein after the mounting, the conductive material covers a first portion of the first surface of the bump and exposes a second portion of the first surface of the bump.

2. The method of claim 1 wherein:
   providing a first substrate comprises forming a plurality of bumps on the first substrate, each of the plurality of bumps having a volume of conductive material disposed thereon;
   providing a second substrate comprises forming a plurality of conductive traces on the second substrate; and
   mounting the first substrate to the second substrate comprises electrically connecting the plurality of bumps with respective ones of the plurality of conductive traces.

3. The method of claim 1, wherein the conductive material is solder.

4. The method of claim 3, further comprising calculating a volume of solder to form a solder joint having a predetermined width.

5. The method of claim 4, wherein the predetermined width is less than a width of the bump.

6. The method of claim 1, wherein a sidewall of the bump extending from the first surface of the bump to a passivation layer in the first substrate is continuously substantially linear from the first surface of the bump to the passivation layer in a cross-sectional view of the bump.

7. The method of claim 1, wherein after the mounting, the conductive material covers at least a portion of a first sidewall of the bump, and a second sidewall of the bump opposing the first sidewall is free of the conductive material.

8. The method of claim 1, wherein after the mounting, the conductive material extends at least half of a height of a sidewall of the conductive trace, and is spaced apart from the second substrate.

9. A method comprising:
   disposing a solder joint on a bump electrically connected to a conductive land in a first substrate, wherein a first surface of the bump opposite to the conductive land has a first width, and wherein a first sidewall of the bump continuously extends from the first surface of the bump to a passivation layer in the first substrate, and wherein the first sidewall of the bump is substantially linear along an entire distance from the first surface of the bump to the passivation layer in a cross-sectional view of the bump;
   aligning the first substrate to a second substrate by aligning the solder joint to a conductive trace of the second substrate; and
   reflowing the solder joint to bond the solder joint with the conductive trace, wherein in the cross-sectional view of the bump, the solder joint wets the first sidewall of the bump without wetting a second sidewall of the bump opposite the first sidewall, and wherein a lateral surface of the conductive trace contacting the solder joint has a second width less than the first width.

10. The method of claim 9 further comprising prior to reflowing the solder joint, plasma treating a surface of the conductive trace.

11. The method of claim 9 further comprising prior to reflowing the solder joint, removing oxidation or foreign material from a surface of the conductive trace.

12. The method of claim 9 further comprising calculating a volume of solder to form the solder joint having a predetermined width less than a width of the bump.

13. The method of claim 9, wherein a second surface of the bump opposite the first surface has a second width less than the first width.

14. The method of claim 9, wherein a second surface of the bump opposite the first surface has a second width greater than the first width.

15. The method of claim 9, wherein the first surface of the bump is spaced apart from the conductive trace, wherein at least a portion of the first surface of the bump opposite the conductive land is substantially free of any solder.

16. The method of claim 9, wherein the solder joint wets more than 50%, but less than 100%, of a height of a sidewall of the conductive trace.

17. A method comprising:
   disposing a bump on a first package component, the first package component comprising:
      a die substrate;
      a conductive land over the die substrate; and
      a dielectric layer over and covering edges of the conductive land, wherein the bump is disposed over and electrically connected to the conductive land, wherein a surface of the bump opposite the conductive land is substantially level, wherein a sidewall of the bump extending from the dielectric layer to the surface of the bump is substantially straight in a cross-sectional view of the bump, wherein the bump forms a first interface with the conductive land, wherein the bump forms a second interface with the dielectric layer, and wherein the first interface is substantially parallel to the second interface;
   disposing a solder region on the surface of the bump opposite the conductive land; and
   bonding the first package component to a second package component, the second package component having a conductive trace formed over a surface thereof, wherein after bonding the first package component to the second package component, the solder region extends along a sidewall of the conductive trace from an upper surface of the conductive trace toward the second package component by a first height, wherein the first height is equal to or larger than a half of a second height of the sidewall of the conductive trace, wherein the first height is smaller than the second height.

18. The method of claim 17, wherein the surface of the bump opposite the conductive land is wider than the conductive trace.

19. The method of claim 17, wherein the sidewall of the bump is substantially perpendicular to a major surface of the die substrate.

20. The method of claim 17, wherein the sidewall of the bump is non-perpendicular to a major surface of the die substrate.

* * * * *